(12) United States Patent
Chik et al.

(10) Patent No.: US 7,679,102 B2
(45) Date of Patent: Mar. 16, 2010

(54) CARBON PASSIVATION IN SOLID-STATE LIGHT EMITTERS

(75) Inventors: George Chik, Nepean (CA); Thomas MacElwee, Nepean (CA); Iain Calder, Kanata (CA); E. Steven Hill, Ottawa (CA); Peter Mascher, Dundas (CA); Jacek Wojcik, Stoney Creek (CA)

(73) Assignees: Group IV Semiconductor, Inc., Ottawa (CA); McMaster University, Hamilton (CA)

( * ) Notice: Subject to any disclaimer, the term of this patent is extended or adjusted under 35 U.S.C. 154(b) by 482 days.

(21) Appl. No.: 11/642,786

(22) Filed: Dec. 21, 2006

(65) Prior Publication Data

US 2007/0181906 A1 Aug. 9, 2007

Related U.S. Application Data

(60) Provisional application No. 60/754,185, filed on Dec. 28, 2005, provisional application No. 60/800,422, filed on May 16, 2006.

(51) Int. Cl.
*H01L 29/06* (2006.01)
*H01L 31/072* (2006.01)
*H01L 31/109* (2006.01)
*H01L 31/0328* (2006.01)
*H01L 31/0336* (2006.01)
*H01L 33/00* (2006.01)

(52) U.S. Cl. ............... 257/102; 257/88; 257/12; 257/14

(58) Field of Classification Search ............ 257/12–18, 257/79–103, E21.35
See application file for complete search history.

(56) References Cited

U.S. PATENT DOCUMENTS

| | | | |
|---|---|---|---|
| 6,525,337 B1 * | 2/2003 | Ugajin et al. | 257/14 |
| 7,522,647 B2 * | 4/2009 | Hatori et al. | 257/103 |
| 7,592,618 B2 * | 9/2009 | Khang et al. | 257/13 |
| 2004/0149353 A1 | 8/2004 | Hill | |
| 2004/0151461 A1 | 8/2004 | Hill | |
| 2004/0214362 A1 | 10/2004 | Hill et al. | |
| 2004/0252738 A1 | 12/2004 | Hill | |

\* cited by examiner

*Primary Examiner*—Cuong Q Nguyen
(74) *Attorney, Agent, or Firm*—Teitelbaum & MacLean; Neil Teitelbaum; Doug MacLean

(57) ABSTRACT

A solid state light emitting device comprises one or more active layers comprising semiconductor nano-particles in a host matrix, e.g. silicon nano-particles in silicon dioxide or silicon nitride. The incorporation of carbon in the active layers provides a great improvement in performance through shortened decay time and enhance emission spectra, as well as reliability and lifetime. The emission wavelengths from the nano-particles can be made to correspond to the quantization energy of the semiconductor nano-particles, which allows the entire visible range of the spectrum be covered. Ideally an engineered structure of alternating active and buffer material layers are disposed between AC or DC electrodes, which generate an electric field. The buffer layers are comprised of a wide bandgap semiconductor or dielectric material, and are designed with a thickness, in the direction of an applied electric field, that ensures that electrons passing therethrough picks up enough energy to excite the nano-particles in the adjacent active layer at a sufficient excitation energy to emit light efficiently at a desired wavelength.

23 Claims, 9 Drawing Sheets

CARBON PASSIVATION IN SOLID-STATE LIGHT EMITTERS

CROSS-REFERENCE TO RELATED APPLICATIONS

The present invention claims priority from U.S. patent applications Ser. Nos. 60/754,185 filed Dec. 28, 2005, and 60/800,422 filed May 16, 2006 which are incorporated herein by reference.

TECHNICAL FIELD

The invention relates to solid-state lighting devices, and in particular to carbon doping for passivating semiconductor nano-particles in a wide bandgap semiconductor or dielectric matrix used as an active light-emitting layer in sold state lighting devices.

BACKGROUND OF THE INVENTION

The next generation of solid-state lighting is seeking to provide advances in brightness, efficiency, color, purity, packaging, scalability, reliability and reduced costs. The creation of light emitting devices from silicon based materials, upon which the modern electronic industry is built, has been the subject of intensive research and development around the world. The main obstacle has been the indirect energy gap of bulk silicon, which limits the efficiency to an extremely low level. However, one particular technology, based on silicon nano-particles, e.g. nanocrystals, formed through various techniques, has been able to overcome this difficulty.

Prior art light emitting devices, such as those disclosed in United States Patent Publication Nos. 2004/149,353, entitled: "Doped Semiconductor Powder and Preparation Thereof", published Aug. 5, 2004 in the name of Hill; 2004/151461, entitled: "Broadband optical pump source for optical amplifiers, planar optical amplifiers, planar optical circuits and planar optical lasers fabricated using group IV semiconductor nanocrystals", published Aug. 5, 2004 in the name of Hill; 2004/214,362, entitled: "Doped semiconductor nanocrystal layers and preparation thereof", published Oct. 28, 2004 in the name of Hill et al; and 2004/252,738, entitled: "Light emitting diodes and planar optical lasers using IV semiconductor nanocrystals", published Dec. 16, 2004 in the name of Hill, which are incorporated herein by reference, have demonstrated that using silicon-rich silicon oxide (SRSO), which consists of silicon nano-particles embedded in a silicon dioxide ($SiO_2$ or glass) matrix, reduces many of the problems associated with bulk silicon, and when doped with erbium, or other rare earth material, can exhibit efficient room temperature rare earth luminescence because of the high efficiency of the energy transfer process from excited nanocrystals to rare earth ions. Accordingly, the SRSO provides an alternative to thin film electroluminescent material. The silicon nano-particles act as classical sensitizer atoms that absorb incident photons or electrons and then transfer the energy to the rare earth ions, which then fluoresce in the infrared or visible wavelength ranges with several advantages compared to the direct fluorescence of the rare earth. First, the absorption cross-section of the silicon nano-particles is larger than that of the rare earth ions by more than three orders of magnitude. Second, as excitation occurs via an Auger-type interaction or via a Forster transfer process between carriers in the silicon nano-particles and rare earth ions, incident photons need not be in resonance with one of the narrow absorption bands of the rare earth. Unfortunately, existing approaches to developing such silicon nano-particle materials have only been successful at producing very low concentrations of the rare earth element, which is not sufficient for many practical applications.

Observations have shown that silicon nano-particles formed by such techniques generally have a relatively narrow distribution of photo-luminescent (PL) wavelength or energy despite the broad size distribution, i.e. the observed energies are not as high as expected from the quantum confinement of the nanocrystals. The reduced nano-particle excitation energy affects the efficiency of energy transfer from conducting electrons when films with embedded nano-particles are electrically powered, thereby causing severe limitations on the efficiency of light generating capability therefrom.

In general, the manufacture of group IV semiconductor nano-particles doped with a rare earth element is done by ion implantation of silicon ions into a silicon oxide layer, followed by high temperature annealing to grow the silicon nano-particles and to reduce the ion implantation damage. The implantation of silicon ions is followed by an ion implantation of the rare earth ions into the annealed silicon nanoparticle oxide layer. The resulting layer is again annealed to reduce the ion implant damage and to optically activate the rare earth ion.

There are several problems with this method:

i) it results in a decreased layer surface uniformity due to the ion implantation;

ii) it requires an expensive ion implantation step;

iii) it fails to achieve a uniform distribution of group IV semiconductor nano-particles and rare earth ions unless many implantation steps are carried out;

iv) it requires a balance between reducing the ion implant damage by thermal annealing while trying to maximize the optically active rare earth; and v) the thickness of the film is limited because implanted ions do not penetrate deeply into the film for practical implant energies.

To diminish the above drawbacks, plasma enhanced chemical vapor deposition (PECVD) has been utilized to make group IV semiconductor nano-particle layers. The prepared layers are subjected to a rare earth ion implantation step, and a subsequent annealing cycle to form the group IV semiconductor nano-particles and to optically activate the rare earth ions that are doped in the nano-particle region. Unfortunately, the layers prepared with this method are still subjected to an implantation step, which results in poor surface uniformity, non-uniform distribution of rare earth elements, and limited film thickness.

Another deposition method that has been used to obtain a doped group IV semiconductor nano-particle layer consists of co-sputtering the group IV semiconductor and rare earth metal, typically in an oxygen plasma. In this method, the group IV semiconductor and the rare earth metal were placed on a target substrate, which was then placed into a vacuum chamber and exposed to an argon ion beam. The argon ion beam sputtered off the group IV semiconductor and the rare earth metal, both of which were deposited onto a receiving silicon wafer. The newly formed film on the silicon wafer was then annealed to grow the nano-particles and to optically activate the rare earth ions. The doped group IV semiconductor nano-particle layers made through this method have the drawbacks that: i) the layer does not have a very uniform distribution of nano-particles and rare earth ions; ii) the layer suffers from up conversion efficiency losses due to rare earth clustering in the film; and iii) the concentration of rare earth film in the film is limited to little more than 0.1%.

An object of the present invention is to overcome the shortcomings of the prior art by providing a carbon doped optically active layer in a solid state light emitting device.

SUMMARY OF THE INVENTION

Accordingly, the present invention relates to a light emitting structure comprising:

a first active layer including semiconductor nano-particles in a host matrix for emitting light at a first wavelength; and a set of electrodes for applying an electric field to the first active layer, thereby exciting the semiconductor nano-particles in the first active layer;

wherein the first active layer is doped with carbon in a concentration of from 1 at % to 20 at % for passivating the semiconductor nano-particles in the first active layer, whereby the first wavelength corresponds to a quantization energy of the semiconductor nano-particles in the first active layer, and whereby the nano-particles in the first active layer have a decay lifetime under ten nanoseconds.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
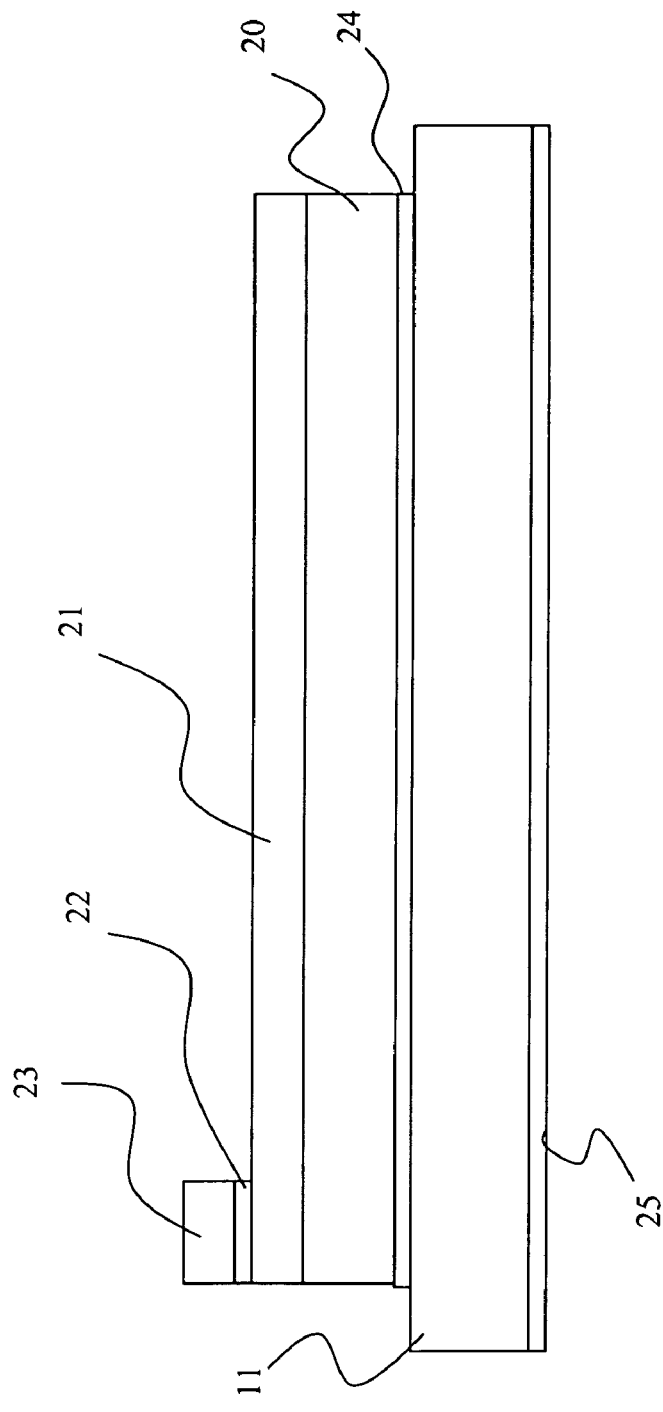
FIG. 1 is a cross-sectional view of an electroluminescent solid-state device in accordance with an embodiment of the present invention.

With reference to FIG. 1, an embodiment of the present invention provides an electroluminescent solid-state device 1, which incorporates a conductive substrate 11, such as an N-type or a P-type silicon wafer with a light emitting multi-layer film structure 20, including one or more active layers with semiconductor nano-particles or other materials with luminescent centers, deposited thereon. The film structure 20 could be deposited by one of many appropriate methods, such as plasma enhanced chemical vapor deposition (PECVD), molecular beam epitaxy, pulsed laser deposition, sputtering, and sol-gel processes. A top optically-transparent, current-injection layer 21, e.g. indium tin oxide (ITO), is mounted on the film structure 20, which, along with a back electrical contact 5, enables AC or DC power to be applied thereto. Preferably, the current-injection layer 21 has a thickness of from 150 to 500 nm. Preferably, the chemical composition and the thickness of the current injection layer 21 are such that the semiconductor structure has a resistivity of less than 70 ohm-cm. A buffer electrical contact 22, e.g. TiN, is positioned between the front current-injection layer 21 and a top electrical contact 23, e.g. Al. The buffer contact 22 provides an ohmic contact point between the front current-injection layer 21 and the top electrical contact 23, while the top electrical contact 23 provides a suitable surface for wire bonding contact. Other suitable materials for the current injection electrodes 21 and buffer electrical contact 22 might alternatively be employed. A back reflector 24 can be provided between the film structure 20 and the substrate 11 to reflect light that is internally emitted towards the substrate 11 back towards the emitting surface, i.e. the ITO layer 21.

The substrate 11, on which the film structure 20 is formed, is selected so that it is capable of withstanding high temperatures in the order of 1000° C. or more. Examples of suitable substrates include silicon wafers or poly silicon layers, either of which can be n-doped or p-doped, e.g. with $1\times10^{20}$ to $5\times10^{21}$ of dopants per $cm^3$, fused silica, zinc oxide layers, quartz, sapphire silicon carbide, or metal substrates. Some of the above substrates can optionally have a thermally grown oxide layer, which oxide layer can be of up to about 2000 nm in thickness, a thickness of 1 to 20 nm being preferred. Some of the above substrates can optionally have a deposited electrically conducting layer, which can have a thickness of between 50 and 2000 nm, but preferably between 100 and 500 nm. The thickness of the substrate is not critical, as long as thermal and mechanical stability is retained.

The multi-layer film structure 20 can be comprised of a single or of multiple active layers, each layer having an independently selected composition and thickness, e.g. semiconductor (group IV, such as Si, Ge, Sn and Pb) nano-particles in a host matrix, e.g. a dielectric or a wide bandgap semiconductor (group IV, such as Si, Ge, Sn and Pb) oxide or nitride with or without rare earth doping elements and with carbon doping, as will hereinafter described. By using active layers having different compositions, a multi-color structure can be prepared. For example, combining erbium, thulium and europium doped semiconductor nanocrystal layers in a single structure provides a structure that can fluoresce at green (terbium), blue (cerium), and red (europium) or colour combinations thereof. The layers can be either stacked or constructed side by side as separately controllable circuit elements.

Figure 2:
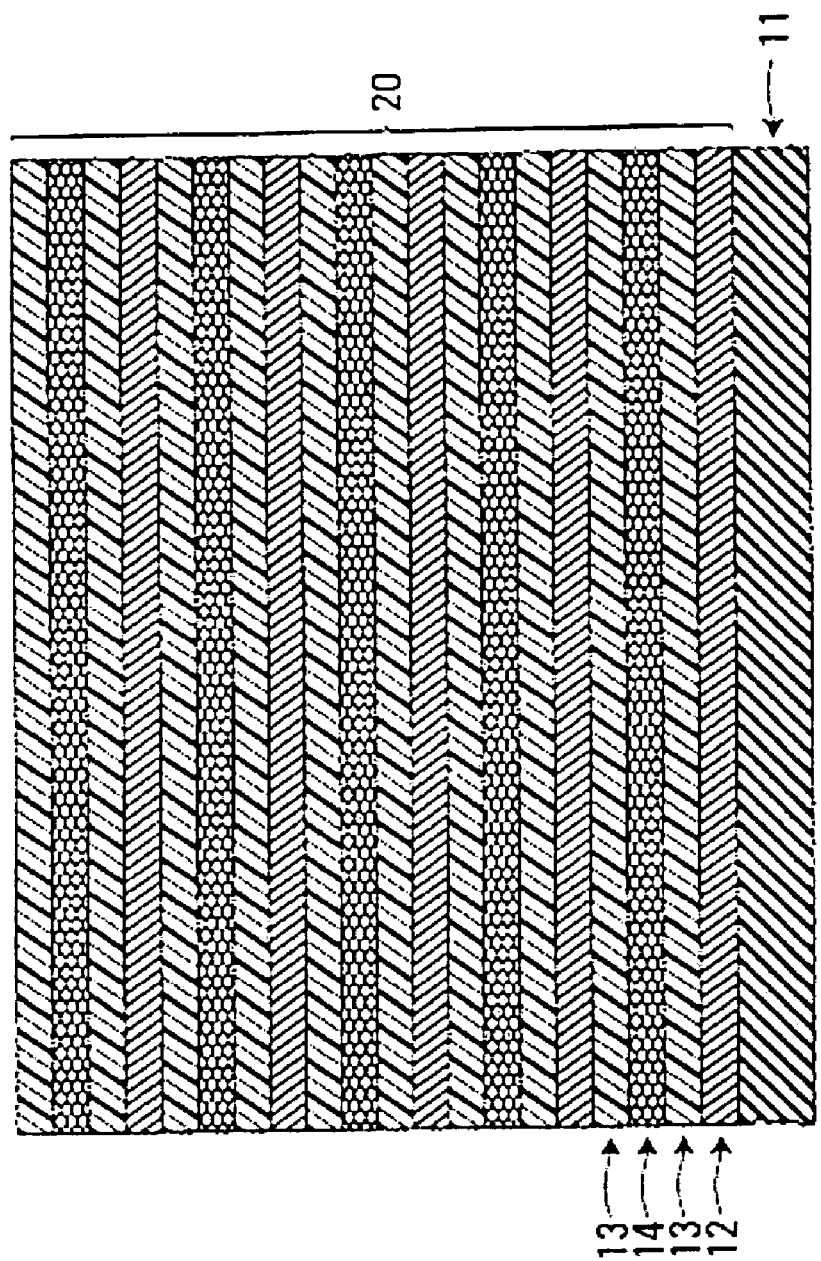
FIG. 2 is a cross-sectional view of a super-lattice semiconductor structure in accordance with the device of FIG. 1.

One type of preferred multi-layer structure 20 provided by an embodiment of the present invention is a super-lattice structure, shown by way of example in FIG. 2, which structure comprises multiple active layers 12 and 14, e.g. semiconductor nano-particle, with buffer layers 13 interleaved therewith on a substrate 11. Each of the active layers 12 and 14 has a thickness of from 1 nm to 10 nm, and is deposited on the substrate 11. Each of the active layers 12 and 14 can comprise the same or different rare earth doping elements, e.g. layer 12 may contain a different rare earth element from layer 14. The active layers 12 and 14 are separated by, i.e. alternate with, the buffer layers 13, such as silicon dioxide layers. The transparent current injection layer 21, e.g. and ITO current injection layer, is deposited on top of the multi-layer structure 20 of the super-lattice structure. There is no maximum thickness for the super-lattice structure, although a thickness of from 50 to 2000 nm is preferred and a thickness of from 150 to 750 nm is more preferred depending upon the available amount of voltage.

The structures shown in FIG. 1 and the figures that follow show adjacent layers in contact with each other without intervening layers; however, additional layers can be utilized to the extent they do not interfere with the recited layers. Therefore, the terms coating and in contact do not exclude the possibility of additional intervening but non-interfering layers.

Figure 3:
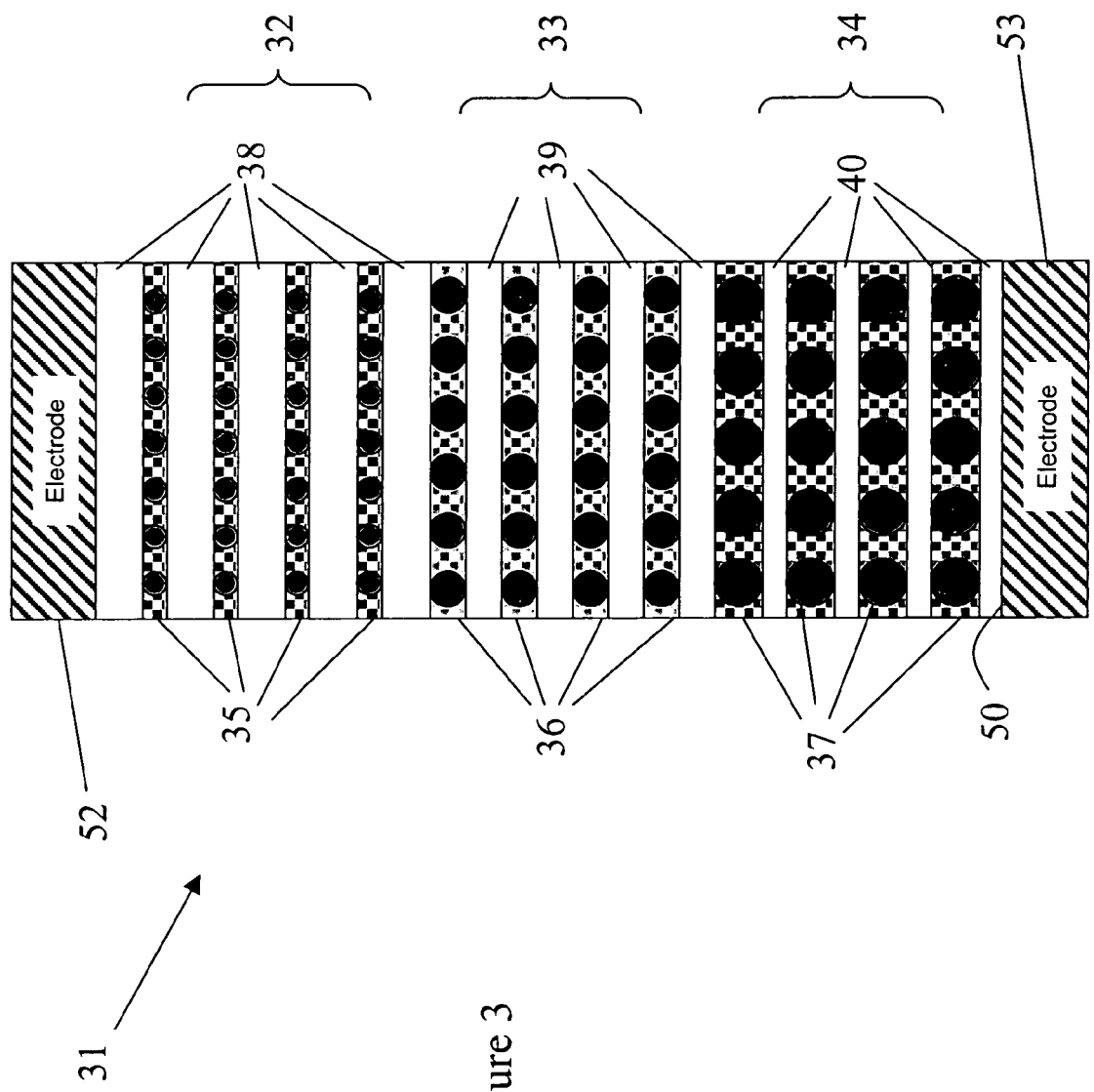
FIG. 3 is a cross-sectional view of an alternative super-lattice semiconductor structure in accordance with the device of FIG. 1.

With particular reference to FIG. 3, an engineered film structure 31, according to another embodiment of the present invention, is formed by a plurality of different sets 32, 33 and 34 of organized layers, in which the active layers 35, 36 and 37 are separated by buffer layers 38, 39 and 40, respectively, comprised of a pure wide bandgap semiconductor or dielectric material.

For engineered film structures 31 driven by AC voltage, a pair of electrodes 52 and 53 are positioned on opposite sides of the stack of layers 35 to 40. Buffer layers 35 and 37 are disposed next to the electrodes 44 and 45, respectively, as the current will flow in both directions as the voltage oscillates. Ideally one of the electrodes, e.g. electrode 52, is transparent, e.g. ITO, and a reflective layer or coating 50 is added between one of the electrodes, e.g. electrode 53, and the remaining stack of layers 35 to 40 to reflect any light back through the transparent electrode 52.

Preferably, the size of the nano-particles, e.g. nanocrystals, is approximately equal to the thickness of the active layer 35, 36 and 37 (or 12 and 14 above) in which they reside. The size of the nano-particles in each active layer 35, 36 and 37, i.e. the thickness of the layer 35, 36 and 37, is designed for a specific excitation energy to produce a desired colored light emission. A theoretical relationship between nano-particle diameter d (in nanometers) and excitation energy E (in electron-volts) for silicon nano-particles in a silicon dioxide matrix host doped with rare earth is given by:

$$E=1.143+5.845/(d^2+1.274d+0.905)-6.234/(d^2+3.391d+1.412);$$

For example, ~1.9 eV for red photons (d=2.9 nm), ~2.3 eV for green photons (d=2.1 nm), or 2.8 eV for blue photons (d=1.6 nm). The rare earth ion species placed within or next to a nano-particle layer is selected to radiate at a wavelength matched to the excitation energy of the nano-particles within the layer (or vice versa).

For group IV, e.g. silicon, nano-particles in a silicon nitride matrix host without rare earth doping or for group IV, e.g. silicon, nano-particles in a silicon dioxide matrix host without rare earth doping the excitation energy equation to generate a specific excitation energy to produce a desired colored light emission from the nano-particles has been shown to be:

$$E=E_0+C/d^2$$

Where $E_0$=1.16 eV and C=11.8 eV-nm²

Accordingly, the thickness of the red light emitting layer, i.e. the diameter of the nanocrystals in an active layer with silicon nano-particles in a silicon nitride matrix, is 4 nm, 3.25 nm for the green layer, and 2.6 nm for the blue layer.

The thickness of the buffer layers 38, 39 and 40 (or 13 above) are closely matched to the size of the nano-particles in the neighboring nano-particle active layers 35, 36 and 37 (or 12 and 14 above). For an electric field applied perpendicular to the plane of the layers 35 to 40, an electron must gain sufficient energy from the applied electrical field to excite the nano-particles to the correct energy—the energy gained in the buffer layers 38, 39 and 40 (measured in eV) is equal to the electric field multiplied by the thickness of the buffer layer 38, 39 or 40. For example, for an applied electrical field of 5 MV/cm, the thickness of the buffer layer must be 3.8 nm or thicker to excite a nano-particles to 1.9 eV (1.9 eV/0.5 eV/nm=3.8 nm), 4.6 nm or thicker to excite a nano-particle to 2.3 eV, or 5.6 nm or thicker to excite a nano-particle to 2.8 eV.

For engineered film structures 31 powered by ac electrical power, in which neighboring nano-particle layers, e.g. 35 and 36, emit at different wavelengths, the intervening buffer layer, e.g. 38, must be thick enough to excite the nano-particles in the higher energy layer.

The engineered film structure 31 provides a great improvement in luminous flux (optical output power), efficiency (internal power conversion efficiency and external luminous efficacy), colour rendering index (CRI), device reliability and lifetime, and device manufacturability/cost/yield of solid state light emitting devices based on silicon nanocrystals in a silicon oxide matrix and doped with rare earth ions and other impurities, such as carbon.

Rare earth ions may be incorporated into the active layers 35, 36 and 37, into the buffer layers 38, 39 and 40, or into both. The preferred structure incorporates rare earths only within the active layers 35, 35 and 37, with a concentration such that the efficiency of energy transfer from the nano-particles to the rare earth ions is maximized and the radiative emission efficiency of the excited rare earth ions is maximized. Due to the complexity of the physical processes involved, optimization is generally an empirical process. The rare earth ion species placed within or next to a nano-particle layer is selected to radiate at a wavelength matched to the excitation energy of the nano-particles within the layer (or vice versa).

Other impurities, if required, will typically be incorporated only within the nano-particle layers 35, 36 or 37, although they could be placed anywhere within the structure 31. For example, since observations have determined that the measured excitation energy of a nano-particle is not as high as expected theoretically, carbon atoms may be required to raise the excitation energy of the nano-particles transferred to the rare earth ions in the semiconductor, e.g. silicon oxide, matrix.

The buffer layers 38, 39 and 40 should be of the highest quality, i.e. dense with few defects, achievable with such materials, within the capabilities of a specific processing technology, whereby the device lifetime and reliability under a high applied electric field will be maximized.

Silicon-rich silicon oxide, with carbon and rare earth doping, for the active layers 35, 36 and 37, and silicon dioxide for the buffer layers 38, 39 and 40 are the preferred materials in the engineered film structure. Other material systems, such as silicon-rich silicon nitride with or without rare earth doping for the active layers 35, 36 and 37, and silicon nitride for the buffer layers 38, 39 and 40, can also be used in this engineered structure. Rare earth oxides or Zinc oxides, which also contain luminescent centers, can also be used in the active layers 35, 36 and 37.

The density of the nano-particles in any active layer can be changed by varying the excess silicon content in said layer during deposition and by varying the annealing conditions (annealing temperature and time, for example). The nano-particle density, within the nano-particle layers 35, 36 and 37, is preferably as high as possible to increase the intensity of emitted light, while still remaining below the density that would result in interactions between nano-particles, or agglomeration of nano-particles.

The total number of repeated layers 35 to 40 in the structure 31 is determined by the voltage that will be applied to the entire film and by the electric field required for efficient and reliable operation. In a simple approximation, very little voltage is dropped across the nano-particle layers 35, 36 and 37, so that the number of layers required will be equal to the applied voltage divided by the electric field and divided by the thickness of the buffer layers 38, 39 and 40. For example, if the applied voltage is 110 V, the desired electric field within one buffer layer 39 is 5 MV/cm (i.e. 0.5 V/nm), and the desired excitation energy is 2.3 eV, whereby the nano-particle layer 36 is 2.1 nm thick and the buffer layer is 4.6 nm thick, then the total number of repeated layer pairs 36/39 is:

(110 V)/(0.5 V/nm)/(4.6 nm)=48 layers or pairs.

A single colour can be emitted by an engineered film structure by repeating identical pairs of active and buffer layers, e.g. multi-layer structure 20 with identical active layers 12 and 14. Mixed colors, e.g. white, can be emitted by the engineered structure 31, since the entire film will comprise several layer pairs for each constituent colour. For example, N pairs of active/buffer layers altogether may comprise k pairs for blue 35/38, m pairs for green 36/39, and n pairs for amber/red/orange 37/40, where k+m+n=N. The number of each of the colour pairs, e.g. 35/38, 36/39 and 37/40, can be varied so that any desired color rendering index (CRI) can be achieved. For example, a warm white requires more pairs of red than blue 35/38, while a cool white requires the opposite.

For white or other multi-colour light emission, and for a device 31, in which a back reflector 50 is included in the structure, it is preferable to place the lowest energy (longest wavelength, e.g. red) emission layers nearest to the reflector 50 and the highest energy (shortest wavelength, e.g. blue) layers nearest to the emitting surface. Layers emitting intermediate wavelengths, e.g. green, are placed intermediate the layers emitting the longest and shortest wavelengths.

Figure 4:
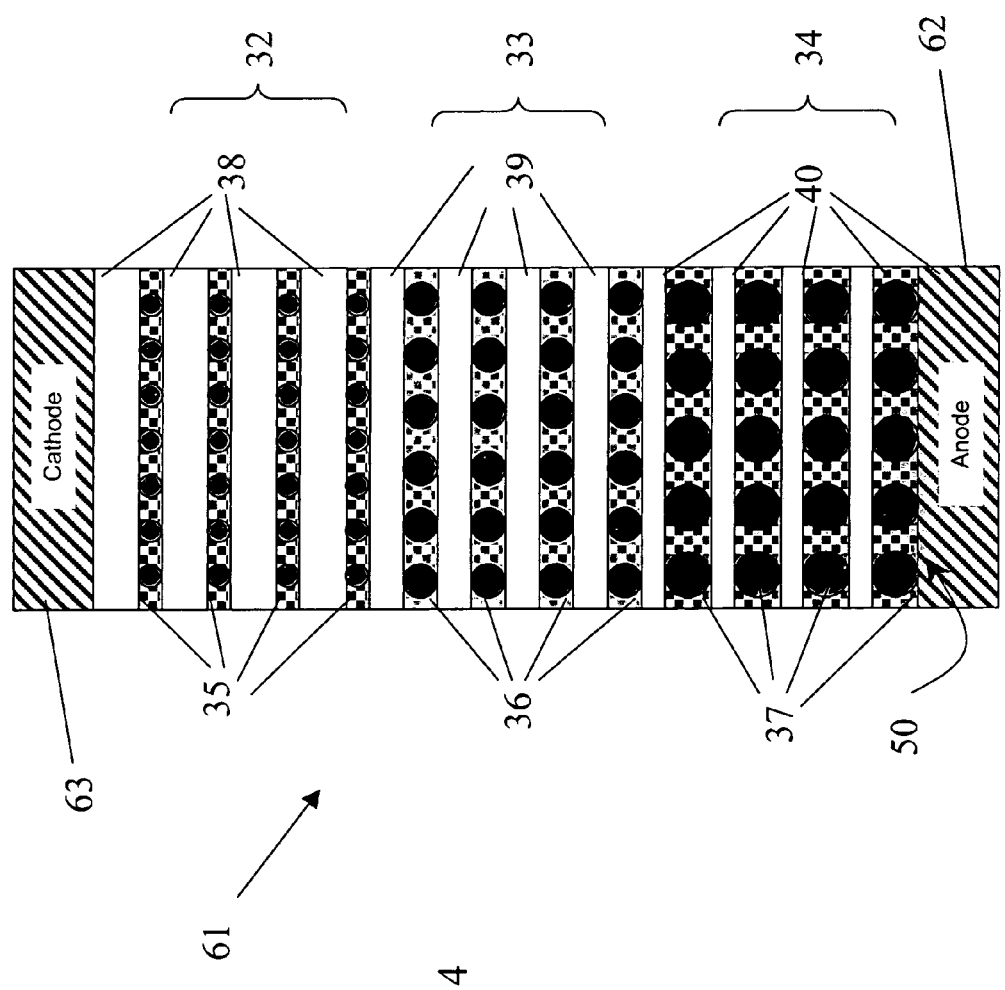
FIG. 4 is a cross-sectional view of an alternative super-lattice semiconductor structure in accordance with the device of FIG. 1.

FIG. 4 illustrates an engineered film structure 61 powered by DC electrical power, i.e. an anode 62 and a cathode 63. The active layers 35, 36 and 37 and most of the buffer layers 38, 39 and 40 are identical to those in the engineered film structure 31; however, since the electrons only travel in one direction, the intervening buffer layers between different types of active layers must be the correct thickness to excite the nano-particles in the nano-particle layer closer to the anode 62. Accordingly, the engineered film structure 61 is preferably terminated by a buffer layer 38 at the cathode 63 and by a nano-particle layer 37 at the anode 62.

Process Details

Any process technology used to deposit the multi-layer film structures 20, 31 or 61 must be capable of varying the film composition on a scale of approximately 1 nm. The preferred deposition technology is plasma enhanced chemical vapor deposition (PECVD), preferably enhanced by electron cyclotron resonance (ECR-PECVD) or by an inductively coupled plasma (ICP-PECVD). Alternatively metal-organic chemical vapor deposition (MOCVD). Other deposition technologies with the required capability are molecular beam epitaxy (MBE); chemical beam epitaxy (CBE); atomic layer epitaxy (ALE); and pulsed laser deposition (PLD), also called pulsed laser epitaxy (PLE). There are many other thin film growth processes that are variations on the techniques described above. Any of these techniques may also be suitable for deposition of the structured films described in the previous section.

In our original homogeneous structure, nano-particle size is affected by excess semiconductor, e.g. silicon, concentration, annealing temperature and time, i.e. increasing any of these increases nano-particle size, and possibly by other components of the film, e.g. carbon. In the case of the engineered structure with silicon-rich active layers, the size in the direction perpendicular to the planes is limited by the thickness of the silicon-rich layer and should approximately equal it, unless the excess silicon content is very low. Annealing also has an effect, but that effect will be curtailed once the nano-particle size is roughly equal to the deposited layer thickness, i.e. it could only grow parallel to the plane, and only very slowly. Impurity content may also still have an effect.

Carbon Doped Semiconductor Nanoparticle Layer

Emission wavelengths from silicon nano-particles embedded in an $SiO_2$ matrix are generally located in the near infrared regime around 700 nm, regardless of the size of the nano-particle, which rendered impractical the visible range applications, such as required for general illumination. Also, the decay lifetime of luminescent emission of silicon nano-particle embedded in a $Sio_2$ matrix is determined to be in the range of 10 μs to 100 μs, which also limits the photon emission rate.

By incorporating carbon in the SRSO materials, the emission wavelengths from the nano-particles can be made to correspond to the quantization energy of the silicon nano-particles, which allows the entire visible range of the spectrum be covered. Most importantly, with proper carbon incorporation into the SRSO film, the decay lifetime of the silicon nano-particles embedded in the oxide matrix can be shortened from the conventional 10-100 μs to the range of a few nanoseconds, e.g. under ten nanoseconds.

The basic embodiment of the present invention relates to bulk silicon-rich silicon oxide (SRSO) films in which silicon nano-particles are formed by depositing a SRSO film, followed by annealing the film at a suitable temperature for the proper length of time. Unfortunately, silicon nano-particles formed by such techniques generally have a relatively wide distribution of size, and a similarly wide spatial distribution, i.e. the separation distance between nanocrystals. The spatial distribution affects the efficiency of energy transfer from conducting electrons when these structures are electrically powered. The average distance between nano-particles in the direction of electrical conduction must be large enough so that an electron picks up enough energy from the electric field between nano-particles to excite the light emitting object and produce a photon of the correct colour. Now, because the spatial distribution is isotropic, the overall density of nano-particles in these films must be fairly low (~$5 \times 10^{18}$ cm$^{-2}$). Modeling has shown that with such a low nano-particle density, and with a distribution of nano-particle size and separation, severe limitations are set on the efficiency of light generating capability from such films with embedded nano-particles.

In the films in which the nano-particles are formed by depositing silicon-rich silicon oxide, significant carbon content is incorporated uniformly throughout the films. However, carbon atoms are only required to be very close to (or at the surface of) the silicon nano-particles to raise their excitation energy. If impurities such as carbon atoms remain in the oxide matrix, they could severely impact the physical properties of the oxide, particularly the breakdown field and hence device reliability and lifetime.

An example of an active layer, e.g. 12, 14, 35, 36, 37 of the present invention is a carbon doped semiconductor nano-particle layer comprising a group IV semiconductor oxide layer in which is distributed the semiconductor nano-particles. The group IV element used to prepare the layer is preferably selected from silicon and germanium, and the group IV semiconductor oxide layer is more preferably silicon dioxide. The group IV oxide layer preferably has a thickness of from 1 to 2000 nm, for example of from 50 to 2000 nm, from 50 to 750 nm, from 100 to 250 nm, or from 10 to 50 nm.

The semiconductor nano-particles that are dispersed within the group IV semiconductor oxide layer are preferably the nano-particles of a group IV semiconductor, e.g. Si or Ge.

The nano-particles are preferably from 1 to 10 nm in size, more preferably from 1 to 3 nm in size, and most preferably from 1 to 2 nm in size. Preferably, the group IV semiconductor is present within the oxide layer in a total concentration of from 34 to 53 atomic percent, more preferably in a total concentration of 35 to 40 atomic percent, and most preferably in a concentration of from 35 to 37 atomic percent. The excess amount of the group IV semiconductor is used to produce the nano-particle material.

Preferably, the concentration of carbon is between 1.0 atomic percent to 20 atomic percent, but should not greatly exceed the excess silicon concentration.

Preferably, one or more rare earth elements are dispersed in proximity to the carbon doped semiconductor nano-particles, e.g. a lanthanide element, such as cerium, praeseodymium, neodynium, promethium, gadolinium, erbium, thulium, ytterbium, samarium, dysprosium, terbium, europium, holmium, or lutetium, or it can be selected to be an actinide element, such as thorium. Preferably, the one or more rare earth elements are selected from erbium, thulium, terbium, cerium and europium. The rare earth element can, for example, take the form of an oxide or of a halogenide. Of the halogenides, rare earth fluorides are preferred as they display more intense fluorescence due to field distortions in the rare earth-fluoride matrix caused by the high electro-negativity of fluorine atoms. Most preferably, the rare earth element is selected from elemental rare earths, e.g. erbium, terbium, europium and cerium, or rare earth oxides and fluorides, e.g. erbium oxide, erbium fluoride, terbium oxide, terbium fluoride, cerium oxide, cerium fluoride, europium oxide and europium fluoride.

The one or more rare earth element is preferably present in the group IV semiconductor oxide layer in a concentration of 0.1 to 15 atomic percent, more preferably in a concentration of 0.1 to 5 atomic percent and most preferably in a concentration of 0.2 to 2 atomic percent. High concentrations, e.g. from 5 to 15 at % are preferred for some embodiments. While such a high concentration of rare earth element has led to important levels of quenching reactions in previous doped semiconductor materials, the doped semiconductor nano-particle active layer of the present invention can accommodate this high concentration, as the rare earth element is dispersed on or near the surface of the carbon doped semiconductor nano-particles, which offer a large surface area. The reduced amount of quenching reactions between the rare earth element and the proximity of the rare earth element to the carbon-doped semiconductor nano-particle provide the basis for a carbon and rare earth doped semiconductor nano-particle layer that offers improved optoelectronic properties.

Semiconductor Structure

Preparation of the Doped Semiconductor Nano-particle Layer

The preparation of the carbon/rare earth doped semiconductor nano-particle layer comprises the following two general steps:

(a) the simultaneous deposition of a carbon and semiconductor rich group IV oxide layer (and of one or more rare earth elements, if required); and (b) the annealing of the semiconductor rich group IV oxide layer prepared in (a) to form semiconductor nano-particles from excess group IV semiconductor material.

The semiconductor rich group IV oxide layer comprises a group IV oxide layer, which group IV oxide is preferably $SiO_2$, in which group IV oxide layer is dispersed (one or more rare earth elements, if provided), carbon, and a group IV semiconductor, which semiconductor can be the same as, or different from, the semiconductor that forms the group IV oxide layer.

By "carbon semiconductor rich", it is meant that an excess of carbon and semiconductor is present, which excess will coalesce to form nano-particles, when the carbon doped, semiconductor-rich, group IV oxide layer is annealed. Since the rare earth element is dispersed within the oxide layer when the nano-particles are formed, the rare earth element becomes dispersed on or near the surface of the carbon doped semiconductor nano-particles upon nano-particle formation.

Since the carbon-doped, semiconductor-rich, group IV oxide layer and the one or more rare earth elements are deposited simultaneously, ion implantation of the rare earth element is avoided. Therefore, the group IV oxide layer surface is free of the damage associated with an implantation process. Also, since the rare earth element is deposited at the same time as the carbon-doped, semiconductor-rich, group IV oxide layer, the distribution of the rare earth elements is substantially uniform through the thickness of the group IV oxide layer.

The deposition of the semiconductor rich group IV oxide layer doped with carbon and one or more rare earth elements is preferably carried out by plasma-enhanced chemical vapor deposition (PECVD), by sol gel deposition, or by pulsed laser deposition (PLD). The above three methods each have their respective advantages for preparing the semiconductor rich group IV oxide layer doped with one or more rare earth elements, and the methods are described below.

Pulsed Laser Deposition

Pulsed laser deposition is advantageous for the deposition of the semiconductor rich group IV oxide layer doped with carbon and one or more rare earth elements as it permits the deposition of a wide variety of semiconductors and a wide variety of rare earth elements.

Figure 5:
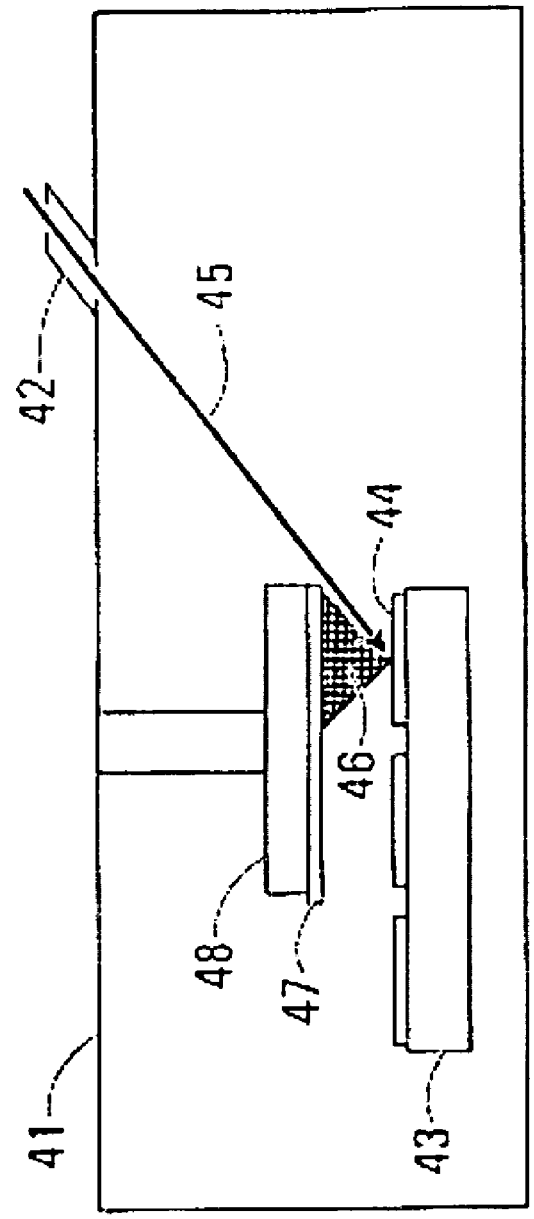
FIG. 5 illustrates a pulsed laser deposition apparatus.

Referring now to FIG. 5, which shows by way of a diagram a typical set up of a pulsed laser deposition apparatus, the pulsed laser deposition apparatus consists of a large chamber 41, which can be evacuated down to at least $10^{-7}$ bars or pressurized with up to 1 atmosphere of a gas, such as oxygen, methane, propane, nitrogen, helium, argon, hydrogen or combinations thereof. The chamber 41 has at least one optical port 42 in which a pulsed laser beam 45 can be injected into the chamber 41 and focused down onto a suitable target 44. The target 44 is usually placed on a carrousel 43 that allows the placement of a different target samples into the path of the pulsed laser focus beam 45. The carrousel 43 is controlled so that multiple layers of material can be deposited by the pulse laser ablation of the target 44. The flux of the focused pulsed laser beam 45 is adjusted so that the target 44 ablates approximately 0.1 nm of thickness of material on a substrate 47, which can be held perpendicular to the target 44 and at a distance of 20 to 75 millimeters above the target 44. The flux for instance is in the range of 0.1 to 20 joules/cm² for 190-355 nm UV laser and has a pulse width of 20-45 nanosecond duration. The target 44 can be placed on a scanning platform 43 so that each laser pulse hits a new area on the target 44, thus giving a fresh surface for the ablation process, which helps prevent the generation of large particles that could be ejected in the ablation plume 46 and deposited on to the substrate 47. The substrate 47 is usually held on a substrate holder 48, which can be heated from room temperature up to 1000° C. and rotated from 0.1 to 30 RPM depending on the pulse rate of the pulse laser, which in most cases is pulsed between 1-10 Hz. The rotation of the substrate 47 provides a method of generating a uniform film during the deposition process. The laser is pulsed until the desired film thickness is met, which can either be monitored in real time with an optical thickness monitor or quartz crystal microbalance or determined from a calibration run in which the thickness is measured from a given flux and number of pulses. Pulsed laser deposition can be used for depositing layers of from 1 to 2000 nm in thickness.

For the preparation of a carbon-doped, semiconductor-rich, group-IV oxide layer doped with one or more rare earth elements, the target 44 that is ablated is composed of mixture of one or more powdered group IV elements, and one or more powdered rare earth elements. The ratio of the various components found in the doped semiconductor nanoparticle layer is decided at this stage by controlling the ratio of the components that form the target. Preferably, the mixture is placed in a hydraulic press and pressed into a disk of 25 mm diameter and 5 mm thickness with a press pressure of at least 500 PSI, while being heated to 700° C. The temperature and pressure are applied for one hour under reduced pressure (e.g. $10^{-3}$ bars) for about one hour. The press pressure is then reduced and the resulting target is allowed to cool to room temperature. The chamber 41 is first evacuated, and then filled with a carbon-based gas, e.g. methane, and/or an oxygen atmosphere. To prepare the carbon-doped, semiconductor-rich, group IV oxide layer, the oxygen/carbon-based gas pressure, which is preferably between $1 \times 10^{-4}$ and $5 \times 10^{-3}$ bar, is selected so as to control the amount of conversion of the group IV elements in the target 44 into a carbon doped group IV oxide, the carbon-based gas concentration is adjusted to ensure that the carbon and the group IV elements are of the desired concentration in the film. Alternatively, the oxygen/methane pressure is selected so that only part of the group IV element is oxidized. The remaining non-oxidized group IV element can then coalesce to form carbon-doped nano-particles when the prepared semiconductor rich group IV oxide layer is annealed.

The one or more powdered rare earth elements that are used to form the target 44 is preferably in the form of a rare earth oxides or rare earth halogenides. As mentioned above, the rare earth fluoride is the most preferred of the rare earth halogenides.

Pulsed laser deposition is useful for the subsequent deposition of two or more different layers. Multiple targets can be placed on the carrousel 43 and the pulsed laser can be focused on different targets during the deposition. Using this technique, layers comprising different rare earth elements can be deposited one on top of the other to prepare semiconductor structures as described earlier. Different targets can also be used to deposit a dielectric layer between the carbon doped semiconductor rich group IV oxide layers, or to deposit a current injection layer on top of the deposited layers. Pulsed laser deposition is the preferred method for preparing the super-lattice semiconductor structure described above with reference to FIGS. 2, 3 and 4.

Preparation of the carbon-doped, semiconductor-rich, group IV oxide layer doped with one or more rare earth elements can of course be carried out with different pulsed laser deposition systems that are known in the art, the above apparatus and process descriptions being provided by way of example.

Sol Gel Deposition

Generation of the carbon-doped semiconductor rich group IV oxide layer can also take place using saline chemistry, such as 3-(trimethylsilyl)-1-propanol, which is added to 2-methoxyethanol in the molar ratio of 1 M. A rare earth precursor, such as erbium acetate, is dissolved into this solution with the amount giving the erbium at 1 atomic percent to silicon. This is spun on an appropriated substrate, such as a silicon wafer, at 2500 rpm for 30 seconds. The film is then baked, e.g. for 5 minutes at 300° C., and repeated until the desired thickness is achieved. Once the desired thickness of film is achieved the film and substrate are then annealed, e.g. in air at 500° C. for 30 minutes, to densify the film and to form the silicon nanoparticles with carbon and rare earth being incorporated with the film.

Plasma Enhanced Chemical Vapor Deposition

PECVD is advantageous for the deposition of the carbon-doped, semiconductor-rich, group IV oxide layer doped with one or more rare earth elements, as it permits the rapid deposition of the layer. The thickness of the carbon-doped, semiconductor-rich, group IV oxide layer doped with one or more rare earth elements prepared with PECVD is 10 nm or greater, more preferably from 10 to 2000 nm.

Formation of a non-doped type IV semiconductor nanoparticle layer through chemical vapor deposition has been described, for example, by J. Sin, M. Kim, S. Seo, and C. Lee in *Applied Physics Letters*, (1998), Volume 72, pg. 1092-1094, the disclosure of which is hereby incorporated by reference.

In an embodiment of the present invention, the carbon doped semiconductor nano-particle layer is prepared by incorporating one or more metal-organic rare earth precursors into the PECVD stream above the receiving heated substrate on which the semiconductor film is grown. PECVD can be used to prepare the carbon from the metal organic used to dope the semiconductor nanoparticle layer where the semiconductor nano-particle is a silicon or a germanium nanoparticle, and where the one or more rare earth elements arise from one or more rare earth metal organic precursors.

In the PECVD process, a group IV element precursor is mixed with oxygen to obtain a gaseous mixture where there is an atomic excess of the group IV element. An atomic excess is achieved when the ratio of oxygen to group IV element is such that, when a group IV dioxide compound is formed, there remains an excess amount of the group IV element. The gaseous mixture is introduced within the plasma stream of the PEVCD instrument, and the group IV element and the oxygen are deposited on a substrate as a group IV dioxide layer in which a group IV atomic excess is found. It is this excess amount of the group IV element that coalesces during the annealing step to form the group IV nanoparticles. For example, to prepare a silicon dioxide layer in which silicon nanoparticle are dispersed, a silicon rich silicon oxide (SRSO) layer is deposited on the substrate.

The group IV element precursor can contain, for example, silicon, germanium, tin or lead, of which silicon and germanium are preferred. The precursor itself is preferably composed of hydrides of the above elements. A particularly preferred group IV element precursor is silane ($SiH_4$).

The ratio (Q) of group IV semiconductor element precursor to oxygen can be selected to be from 3:1 to 1:2. If an excess of group IV element precursor hydride is used, the deposited layer can contain hydrogen, for example: up to approximately 10 atomic percent. The ratio of the flow rates of the group IV element precursor and of oxygen can be kept, for example, between 2:1 and 1:2.

Also introduced into the plasma stream is a rare earth element precursor, e.g. a metal-organic precursor, which precursor is also in the gaseous phase. The rare earth precursor is added to the plasma stream at the same time as the group IV element precursor, such that the rare earth element and the group IV element are deposited onto the substrate simultaneously. Introduction of the rare earth precursor as a gaseous mixture provides better dispersion of the rare earth element within the group IV layer. Preferably, presence of oxygen in the plasma stream and in the deposited layer leads to the deposition of the rare earth element in the form of a rare earth oxide.

The rare earth element precursor comprises one or more ligands. The ligand can be neutral, monovalent, divalent or trivalent. Preferably, the ligand is selected so that when it is coordinated with the rare earth element, it provides a compound that is volatile, i.e. that enters the gaseous phase at a fairly low temperature, and without changing the chemical nature of the compound. The ligand also preferably comprises organic components that, upon exposure to the plasma in the PECVD apparatus, will form gaseous methane that can be reacted with the silicon through gas flow or by reducing the pressure within the PECVD apparatus. When the organic components of the ligand are conducive to producing volatile by-products, e.g. $CH_4$, the resulting organic molecules are incorporated into the deposited layer. Introduction of organic molecules into the deposited layer has beneficial properties, and the presence of organic molecules is sometimes referred to as carbon doping of the semiconductor.

Suitable ligands for the rare earth element can include acetate functions, for example 2,2,6,6-tetramethyl-3,5-heptanedione, acetylacetonate, flurolacetonate, 6,6,7,7,8,8,8-heptafluoro-2,2-dimethyl-3,5-octanedione, i-propylcyclopentadienyl, cyclopentadienyl, and n-butylcyclopentadienyl. Preferred rare earth metal precursor include tris(2,2,6,6-tetramethyl-3,5-heptanedionato) erbium(III), erbium (III) acetylacetonate hydrate, erbium (III) flurolacetonate, tris(6,6,7,7,8,8,8-heptafluoro-2,2-dimethyl-3,5-octanedionate)erbium (III), tris (i-propylcyclopentadienyl)erbium (III), tris (cyclopentadienyl)erbium (III), tris (methylcyclopentadienyl)erbium (III), and tris(n-butylcyclopentadienyl)erbium (III). A particularly preferred rare earth element precursor is tris(2,2,6,6-tetramethyl-3,5-heptanedionato) erbium(III) ($Er^{+3}[(CH_3)_3CCOCH\!=\!COC(CH_3)_3]_3$), which is also referred to as $Er^{+3}(THMD)_3$. Similar precursors are used for other rare earth species in which "erbium" in the aforementioned precursors is replaced by another rare earth species.

When carbon ions are introduced in the film, the excitation energy for a given size of nano-particle is significantly raised. It is desirable to locate the carbon ions in the vicinity of the nano-particles or even within the nano-particles to facilitate efficient energy transfer from the excited nano-particles to the rare earth ions. By incorporating the carbon from the metal-organic precursor along with the rare earth ion that is attached to the organic ligand, we can easily create the desired structure and therefore an efficient means of having the silicon nano-particles excite the rare earth ions. The carbon could also be introduced from an independent source of material, e.g. methane, during the film deposition.

If the rare earth element precursor is not in the gaseous phase at room temperature, it must be transferred to the gaseous phase, for example, by heating in an oven kept between 80° C. and 210° C. The gaseous rare earth element precursor is then transferred to the plasma stream with an inert carrier gas, such as argon. The gaseous rare earth element precursor is preferably introduced to the plasma at a position that is below a position where the group IV element-containing compound is introduced to the plasma. Use can be made of a dispersion mechanism, for example a dispersion ring, to assist in the dispersion of the gaseous rare earth element precursor in the plasma.

In order to obtain a more even deposition of the doped type IV oxide layer, the substrate can be placed on a susceptor that rotates during deposition. A circular rotation of about 3 rpm is suitable for increasing the uniformity of the layer being deposited.

An electron cyclotron resonated (ECR) reactor is suitable for producing the plasma used in the PECVD method described above. ECR is a particular method of generating plasma, where the electrons have a spiral motion caused by a magnetic field, which allows a high density of ions in a low-pressure region. The high ion density with low pressure is beneficial for deposition, as the rare earth metal precursor can be stripped of its organic components and incorporated uniformly and in a high concentration. The plasma used in the PECVD method can comprise, for example, argon, helium, neon or xenon, of which argon is preferred.

An inductively coupled plasma (ICP) can also be used to enhance the PECVD method.

Other deposition technologies with the required capability are metal-organic chemical vapor deposition (MOCVD), molecular beam epitaxy (MBE), chemical beam epitaxy (CBE), atomic layer epitaxy (ALE). There are many other thin film growth processes that are variations on the techniques described above. Any of these techniques may also be suitable for deposition of the structured films described in the previous section.

The PECVD method is carried out under a reduced pressure, for example $1\times 10^{-3}$ torr, and the deposition temperature, microwave power and susceptor bias can be kept constant. Suitable temperature, microwave and susceptor bias values can be selected to be, for example, 300° C., 400 W and $-200$ $V_{DC}$, respectively.

The carbon-doped, semiconductor-rich, group IV oxide layer doped with one or more rare earth elements can be grown at different rates, depending on the parameters used. A suitable growth rate can be selected to be about 60 nm per minute, and the carbon doped semiconductor rich group IV oxide layer can have a thickness of from 10 to 2000 nm, more preferably of from 50 to 750 nm.

Preparation of the carbon-doped, semiconductor-rich, group IV oxide layer doped with one or more rare earth elements can of course be carried out with different plasma enhanced chemical vapour deposition systems that are known in the art, the above apparatus and process descriptions being provided by way of example.

Annealing Step

After the carbon-doped, semiconductor-rich, group IV oxide layer doped with one or more rare earth element has been prepared, the doped type IV oxide layer is annealed, optionally under flowing nitrogen ($N_2$), in a conventional furnace, in a rapid thermal anneal (RTA) furnace or other suitable annealing means, at from about 850° C. to about 1250° C., more preferably from 900° C. to 1100° C., from 5 minutes to 300 minutes, more preferably from 15 to 60 minutes. It is during the annealing step that the atomic excess of semiconductor is converted into semiconductor nano-particles.

When PECVD is used to prepare the carbon-doped, semiconductor-rich, group IV oxide layer doped with one or more rare earth element, the annealing step can also be carried out under a reduced pressure in order to facilitate the removal of any volatile by-products that might be produced.

The amount of excess of the carbon and semiconductor in the group IV oxide layer and the anneal temperature dictate the size and the density of the semiconductor nano-particle present, as well as the concentration of carbon present, in the final carbon doped semiconductor nanoparticle layer. The amount of excess silicon is adjusted to the type of rare earth dopant so that the correct size of nanocrystals excites the rare earth material efficiently, as disclosed in the accompanying disclosure entitled "Engineered Film Structure for Light Emitting Device", which is incorporated herein by reference. Moreover, multi-layer structures, as disclosed in the aforementioned disclosure, are also within the scope of this invention. Similarly, the present invention can incorporate the embodiments detailed in the other accompanying disclosures entitled: "Electric Field Engineering in SRSO Films", Light Emitting devices with very high extraction Efficiency", and "Light emitting devices with shaped source area", which are all incorporated herein by reference.

Since the rare earth element is well dispersed through the deposited group IV semiconductor oxide layer, when the nano-particles are formed during the annealing step, the rare earth element becomes localized on or near the surface of the nanoparticles. Since the carbon doped nano-particles provide a large surface area on which the rare earth element can be deposited, the concentration of the rare earth element can be quite elevated, while retaining good luminescent properties.

The following examples are offered by way of illustration and not by way of limitation.

EXAMPLES

Example 1

Silane ($SiH_4$) and oxygen ($O_2$) are added to an argon plasma stream produced by an electron cyclotron resonated (ECR) reactor via dispersion ring. The ratio (Q) of silane to oxygen has been varied between 3:1, 1.7:1, 1.2:1, 1:1.9 and 1:2. An erbium precursor (tris(2,2,6,6-tetramethyl-3,5-heptanedionato) erbium(III) [$Er^{+3}(THMD)_3$]) is placed in a stainless steel oven held between 80 and 210° C.

A carrier gas of Argon is used to transport the Erbium precursor from the oven through a precision controlled mass-flow controller to a dispersion ring below the silane injector and above the heated substrate. The instrument pressure is kept at about $2\times10^{-4}$ torr. The substrates used are either heavily doped silicon, fused silica or silicon wafers on which is thermally grown an oxide layer of 2000 nm thickness. Alternatively, a reflective substrate, a reflective conducting layer on the silicon or a transparent substrate with a refractory transparent conductor thereon can be used. The deposition temperature, the microwave power and the susceptor bias are kept constant at 300° C., 400 W and $-200 V_{DC}$. The $SiH_4$ and Ar flow rates were adjusted while keeping the $O_2$ flow rate at 20 millitorr $sec^{-1}$ for the various excess silicon content. The Er/Ar flow rate was adjusted to the vapor pressure generated by the temperature-controlled oven for the desired erbium concentration. The film was grown at a rate of 60 nm per minute and thickness has been grown from 250 nm to 2000 nm thick. The susceptor was rotated at 3 rpm during the growth to improve the uniformity of the film. After deposition, the samples were annealed at 950° C. to 1000° C. for 5-6 minutes under flowing nitrogen ($N_2$) in a rapid thermal anneal (RTA) furnace.

Figure 6:
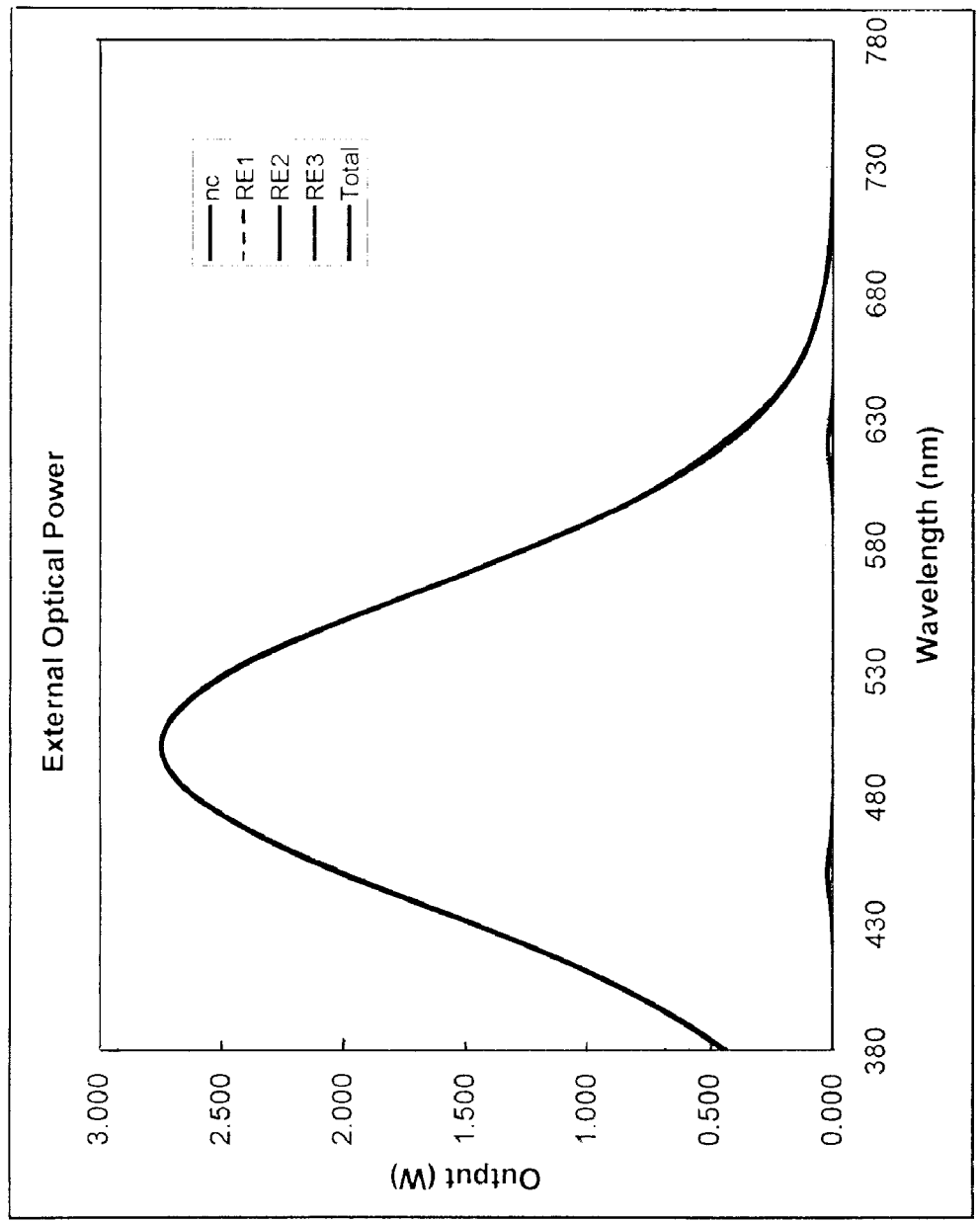
FIG. 6 illustrates a spectral output of the present invention using a carbon doped group IV nanoparticle film.
Figure 7:
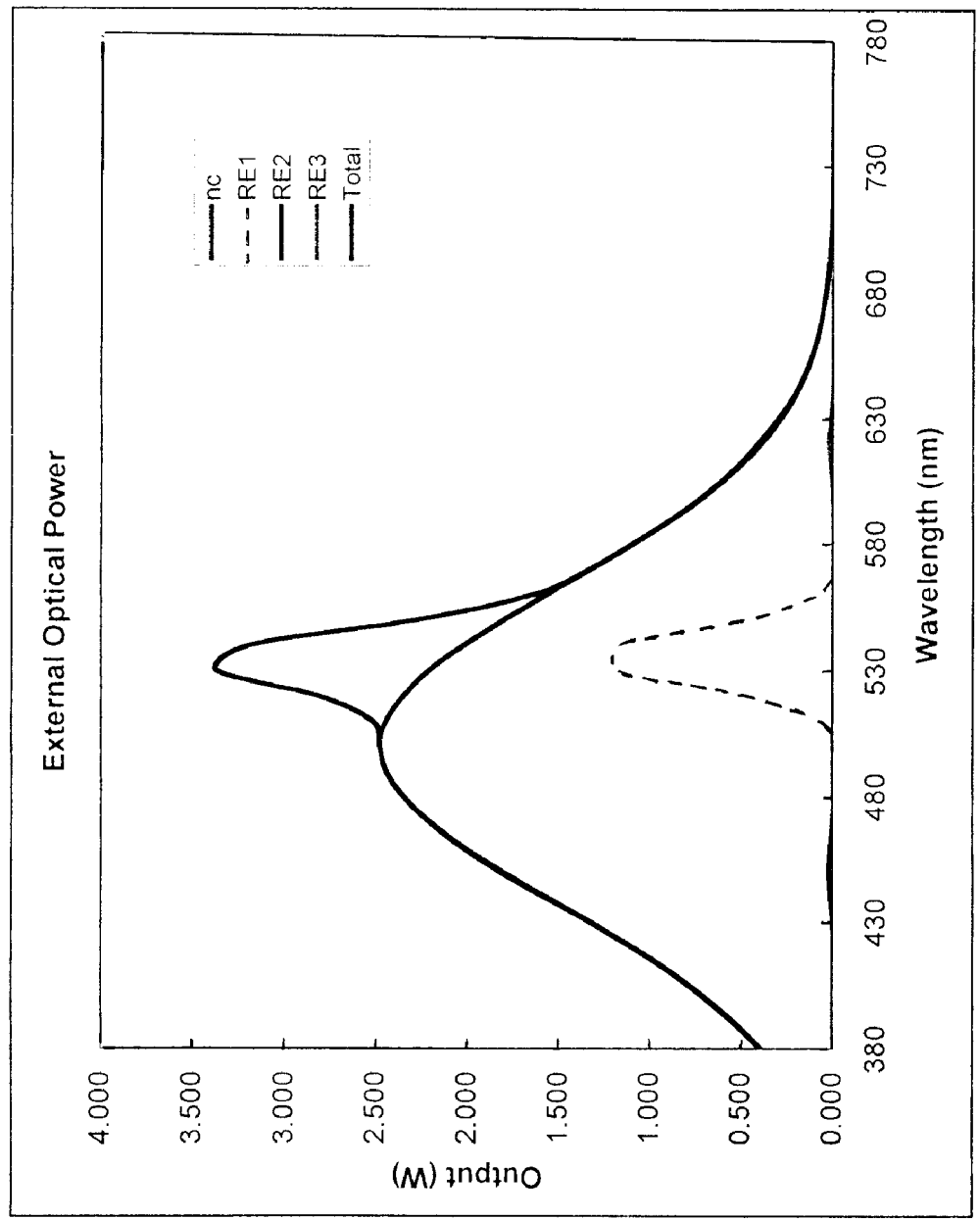
FIG. 7 illustrates a spectral output of the present invention using carbon and a rare earth doped group IV nanoparticle film.
Figure 8:
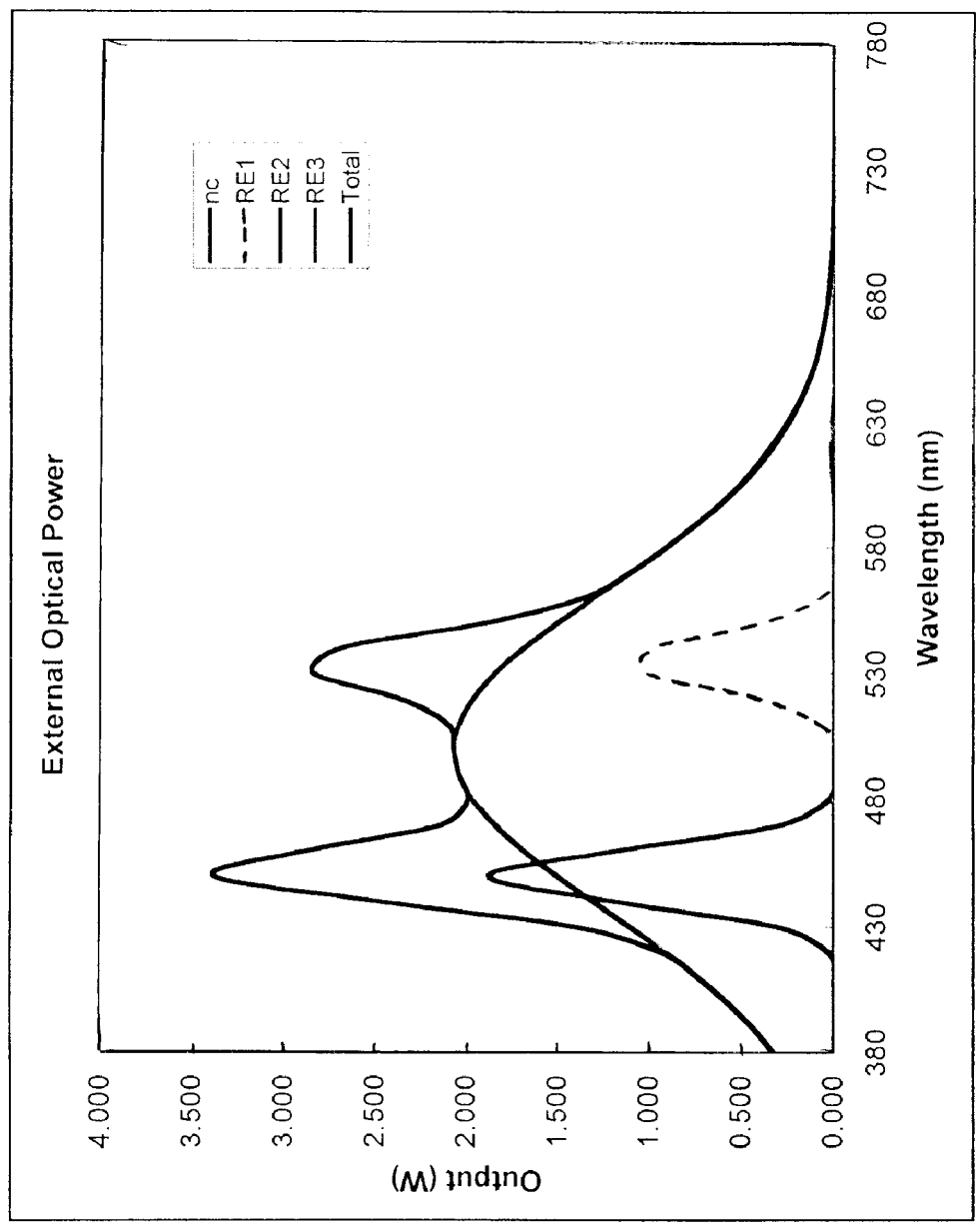
FIG. 8 illustrates a spectral output of the present invention using carbon and two rare earths doped group IV nanoparticle film.
Figure 9:
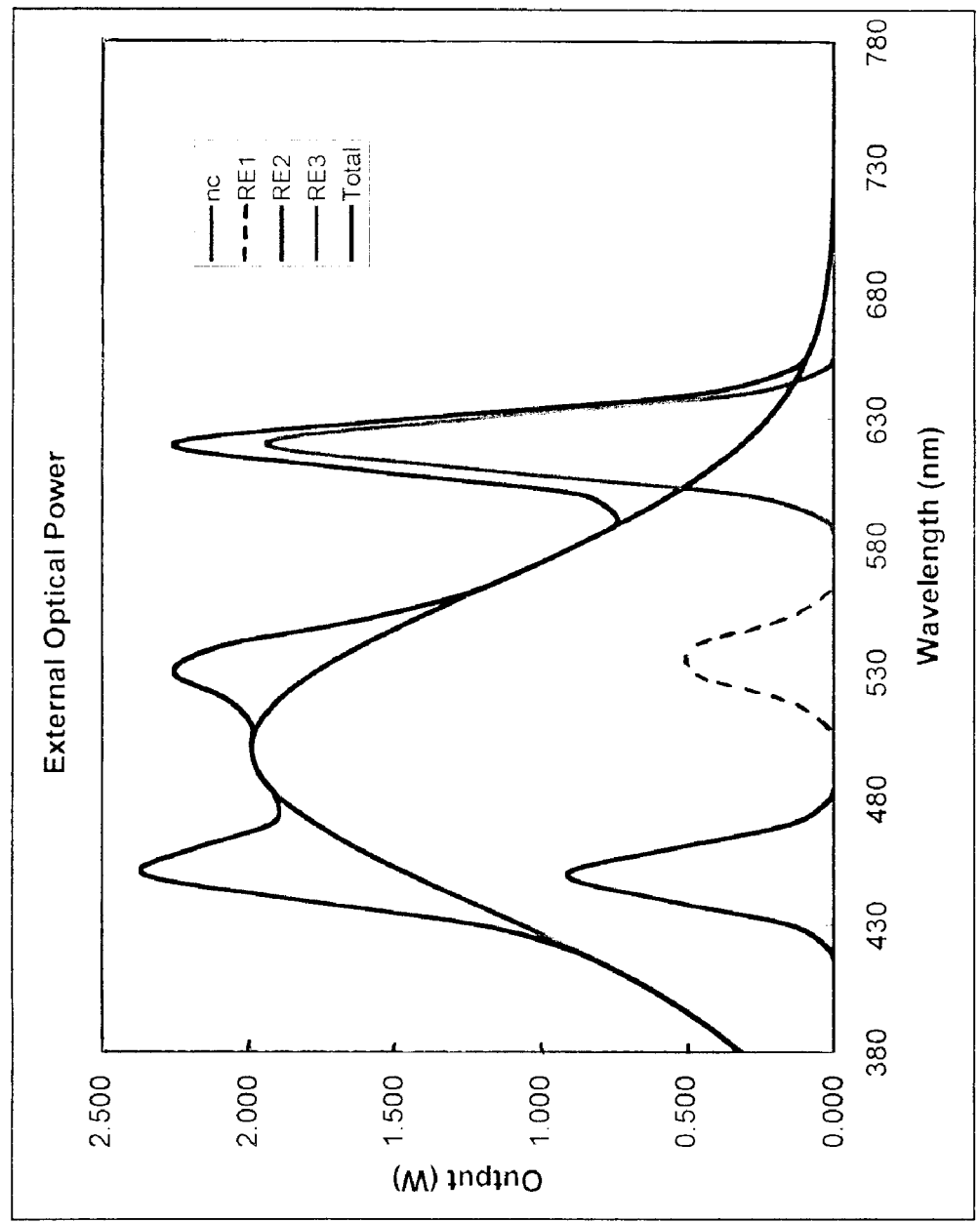
FIG. 9 illustrates a spectral output of the present invention using carbon and three rare earths doped silicon nanoparticle film.

FIG. 6 graphically illustrates the spectral output of carbon-doped, group-IV semiconductor nano-particles. The addition of a single rare earth oxide, i.e. terbium (Tb) oxide, increases the output over the wavelength range from 500 nm to 550 nm, as illustrated in FIG. 7. The addition of a second rare earth oxide, i.e. cerium (Tm) oxide, provides increased output over the wavelength range of 430 nm to 480 nm, as illustrated in FIG. 8. Similarly, the addition of a third rare earth element, i.e. europium (Eu) oxide, increases the output over a wavelength range of 600 nm to 650 nm, as illustrated in FIG. 9.

When the nano-particle layer is formed by a thin semiconductor material only, carbon will then be deposited on top and bottom regions that immediately surround the semiconductor material layer(s).

The present invention of carbon doping for passivating semiconductor nano-particles in a host matrix, e.g. semiconductor oxide or nitride, especially for silicon nano-particles in SRSO—$SiO_2$ engineered film structure provides a great improvement in the performance through shortened decay time and enhanced emission spectra, as well as reliability and lifetime.

All publications, patents and patent applications cited in this specification are herein incorporated by reference as if each individual publication, patent or patent application were specifically and individually indicated to be incorporated by reference. The citation of any publication is for its disclosure prior to the filing date and should not be construed as an admission that the present invention is not entitled to antedate such publication by virtue of prior invention.

We claim:

1. A light emitting structure comprising:
   a first active layer including semiconductor nano-particles in a host matrix for emitting light at a first wavelength; and
   a set of electrodes for applying an electric field to the first active layer, thereby exciting the semiconductor nano-particles in the first active layer;
   wherein the first active layer is doped with carbon in a concentration of from 1 at % to 20 at % for passivating the semiconductor nano-particles in the first active layer, whereby the first wavelength corresponds to a quantization energy of the semiconductor nano-particles in the first active layer, and whereby the nano-particles in the first active layer have a decay lifetime under ten nanoseconds.

2. The light emitting structure according to claim 1, further comprising a first buffer layer comprising a wide bandgap semiconductor or dielectric material adjacent the first active layer;
   wherein the first buffer layer has a thickness whereby electrons gains sufficient energy from the electric field when passing through the first buffer layer to excite the semiconductor nano-particles in the first active layer via impact ionization or impact excitation at a sufficient excitation energy to emit light at the first wavelength.

3. The light emitting structure according to claim 2, further comprising:
   a plurality of additional first active layers; and
   a plurality of additional first buffer layers forming a first stack with first active layers alternating with first buffer layers between the set of electrodes.

4. The light emitting structure according to claim 3, wherein the set of electrodes are powered by an alternating current power source; and wherein one of the first buffer layers is disposed at opposite ends of the first stack to ensure that the nano-particles in all of the first active layers are excited when the electric field changes direction.

5. The light emitting structure according to claim 3, further comprising:
   a plurality of second active layers, each including semiconductor nano-particles in a host matrix for emitting light at a second wavelength, which is different from the first wavelength; and a plurality of second buffer layers forming a second stack with each one of the plurality of second buffer layers being adjacent to one of the plurality of second active layers;

wherein the second active layer is doped with carbon in a concentration of from 1 at % to 20 at % for passivating the semiconductor nano-particles in the second active layer, whereby the second wavelength corresponds to a quantization energy of the semiconductor nano-particles in the second active layer, and whereby the nano-particles in the second active layer have a decay lifetime under ten nanoseconds; and wherein each of the second buffer layers has a thickness whereby electrons gains sufficient energy from the electric field when passing through the second buffer layers to excite the luminescent centers in the second active layers via impact ionization or impact excitation at an excitation energy to emit light at the second wavelength.

6. The light emitting structure according to claim 5, wherein the set of electrodes are powered by an alternating current power source; and wherein one of the first buffer layers is disposed at an outer end of the first stack, one of the second buffer layers is disposed at an outer end of the second stack, and one of the first or second buffer layers, whichever is larger, is positioned between the first and second stacks to ensure that the nano-particles in all of the first and second active layers are excited when the electric field changes direction.

7. The light emitting structure according to claim 5, wherein the first and second wavelengths combine with or without additional wavelengths to form white light.

8. The light emitting structure according to claim 2, further comprising:
a second active layer including semiconductor nano-particles in a host matrix for emitting light at a second wavelength, which is different than the first wavelength; and
a second buffer layer adjacent the second active layer;
wherein the second active layer is doped with carbon in a concentration of from 1 at % to 20 at % for passivating the semiconductor nano-particles in the second active layer, whereby the second wavelength corresponds to a quantization energy of the semiconductor nano-particles in the second active layer, and whereby the nano-particles in the second active layer have a decay lifetime under ten nanoseconds; and
wherein the second buffer layer has a thickness whereby electrons gains sufficient energy from the electric field when passing through the second buffer layer to excite the luminescent centers in the second active layer via impact ionization at an excitation energy or impact excitation to emit light at the second wavelength.

9. The light emitting structure according to claim 2, wherein each nano-particle in the first active layer has a diameter substantially equal to the thickness of the first active layer.

10. The light emitting structure according to claim 9, wherein the diameter of the semiconductor nano-particles in the first active layer corresponds to an excitation energy of the semiconductor nano-particles in the first active layer, which corresponds with the first wavelength.

11. The light emitting structure according to claim 10, further comprising a second active layer comprising semiconductor nano-particles dispersed within a host matrix, each nano-particle in the second active layer having a diameter substantially equal to a thickness of the second active layer; and a second buffer layer adjacent the second active layer, wherein the second buffer layer has thickness, whereby electrons gains sufficient energy from the electric field to excite the semiconductor nano-particles in the second active layer at an excitation energy to emit light at a second wavelength, which is different than the first wavelength;

wherein the second active layer is doped with carbon in a concentration of from 1 at % to 20 at % for passivating the semiconductor nano-particles in the second active layer, whereby the second wavelength corresponds to a quantization energy of the semiconductor nano-particles in the second active layer, and whereby the nano-particles in the second active layer have a decay lifetime under ten nanoseconds; and wherein the diameter of the semiconductor nano-particles in the second active layer corresponds to the excitation energy of the semiconductor nano-particles in the second active layer, which corresponds with the second wavelength.

12. The light emitting structure according to claim 10, further comprising:
a plurality of additional first active layers;
a plurality of additional first buffer layers forming a first stack with first active layers alternating with first buffer layers between the set of electrodes;
a plurality of additional second active layers; and
a plurality of additional second buffer layers forming a second stack with second active layers alternating with second buffer layers between the set of electrodes.

13. The light emitting structure according to claim 12, further comprising:
a plurality of third active layers, each of the third active layers having semiconductor nano-particles in a host matrix defined by a third thickness, each of the semiconductor nano-particles in the third active layers having a diameter substantially equal to the third thickness, the diameter of the semiconductor nano-particles in the third active layer corresponding to the excitation energy of the semiconductor nano-particles, which corresponds with a third wavelength different from the first and second desired wavelengths; and
a plurality of third buffer layers separating the plurality of third active layers from each other, each of the third buffer layers having a thickness whereby an electron gains sufficient energy when passing therethrough from the electric field to excite the semiconductor nano-particles in the third active layer at an excitation energy to emit light at the third wavelength.

14. The light emitting structure according to claim 9, wherein the first active layer is doped with a first rare earth material selected to radiate at a wavelength matched to the excitation energy of the nano-particles in the first active layer, whereby energy is transferred to the first rare earth material, which emits light at the first wavelength.

15. The light emitting structure according to claim 14, further comprising a second active layer comprises semiconductor nano-particles dispersed within a host matrix, each nano-particle in the second active layer having a diameter substantially equal to the thickness of the second active layer;
wherein the second active layer is doped with a second rare earth material, different than the first, selected to radiate at a wavelength matched to the excitation energy of the nano-particles in the second active layer, whereby energy is transferred to the second rare earth material, which emits light at the second wavelength.

16. The light emitting structure according to claim 15, further comprising:
- a plurality of additional first active layers;
- a plurality of additional first buffer layers forming a first stack with first active layers alternating with first buffer layers;
- a plurality of additional second active layers; and
- a plurality of additional second buffer layers forming a second stack with second active layers alternating with second buffer layers.

17. The light emitting structure according to claim 16, further comprising:
- a plurality of third active layers, each of the third active layers having semiconductor nano-particles in a host matrix defined by a third thickness, wherein the third active layer is doped with a third rare earth material, different than the first and second rare earth materials, selected to radiate at a wavelength matched to the excitation energy of the nano-particles in the third active layer, whereby energy is transferred to the third rare earth material, which emits light at the third wavelength; and
- a plurality of third buffer layers separating the plurality of third active layers from each other, each of the third buffer layers having a thickness whereby an electron gains sufficient energy when passing therethrough from the electric field to excite the semiconductor nano-particles in the third active layer at an excitation energy to emit light at the third wavelength.

18. The light emitting structure according to claim 17, wherein the first desired wavelength falls within a range of red wavelengths;
wherein the second desired wavelengths falls within a range of green wavelengths;
wherein the third desired wavelength falls within a range of blue wavelengths;
whereby substantially white light is emitted from the combination of the first, second and third desired wavelengths.

19. The light emitting structure according to claim 16, wherein the set of electrodes comprises a first transparent electrode, and a second base electrode; wherein the light emitting structure further comprises a reflective layer, between the second base electrode and the first transparent electrode, for reflecting light back through the first transparent electrode.

20. The light emitting structure according to claim 19, wherein the plurality of active layers emitting light at a longest wavelength are disposed nearest to the reflector layer, and the active layers emitting light at a shortest wavelength are disposed nearest to the first transparent electrode.

21. The light emitting structure according to claim 1, wherein the first active layer comprises group IV nano-particles in a silicon dioxide matrix host.

22. The light emitting structure according to claim 1, wherein the first active layer comprises group IV nano-particles in a silicon nitride matrix host.

23. The light emitting structure according to claim 1, wherein the set of electrodes comprises a first transparent electrode, and a second base electrode;
wherein the light emitting structure further comprises a reflective layer, between the second base electrode and the first transparent electrode, for reflecting light back through the first transparent electrode.

* * * * *